United States Patent
Chen et al.

(10) Patent No.: US 9,305,847 B2
(45) Date of Patent: Apr. 5, 2016

(54) METHOD OF MANUFACTURING SEMICONDUCTOR DEVICE HAVING GATE METAL

(71) Applicant: UNITED MICROELECTRONICS CORP., Hsinchu (TW)

(72) Inventors: Shin-Chi Chen, Penghu County (TW); Chih-Yueh Li, Taipei (TW); Shui-Yen Lu, Tainan (TW); Chi-Mao Hsu, Tainan (TW); Yuan-Chi Pai, Tainan (TW); Yu-Hong Kuo, Tainan (TW); Nien-Ting Ho, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/314,425

(22) Filed: Jun. 25, 2014

(65) Prior Publication Data
US 2015/0380312 A1    Dec. 31, 2015

(51) Int. Cl.
| H01L 21/8238 | (2006.01) |
| H01L 21/28   | (2006.01) |
| H01L 21/311  | (2006.01) |
| H01L 29/423  | (2006.01) |

(52) U.S. Cl.
CPC .... *H01L 21/82385* (2013.01); *H01L 21/28026* (2013.01); *H01L 21/31111* (2013.01); *H01L 21/31144* (2013.01); *H01L 29/42376* (2013.01)

(58) Field of Classification Search
None
See application file for complete search history.

(56) References Cited

U.S. PATENT DOCUMENTS

| 6,004,843 A * | 12/1999 | Huang ............. H01L 27/10844 257/E21.646 |
| 7,838,946 B2 | 11/2010 | Yu et al. |
| 2006/0094229 A1* | 5/2006 | Ema ................. H01L 21/76802 438/624 |
| 2011/0159654 A1* | 6/2011 | Kronholz .......... H01L 21/28123 438/283 |
| 2012/0313178 A1* | 12/2012 | Liao .................. H01L 29/66545 257/368 |
| 2013/0043517 A1* | 2/2013 | Yin ................... H01L 21/28114 257/288 |
| 2013/0078792 A1 | 3/2013 | Huang et al. |
| 2013/0099307 A1 | 4/2013 | Tseng et al. |
| 2013/0102145 A1* | 4/2013 | Huang ............. H01L 21/32139 438/595 |

OTHER PUBLICATIONS

Tsao, Po-Chao, "U.S. Appl. No. 14/153,079", filed Jan. 13, 2014.

* cited by examiner

*Primary Examiner* — Steven Loke
*Assistant Examiner* — Juanita Rhodes
(74) *Attorney, Agent, or Firm* — WPAT, PC; Justin King

(57) ABSTRACT

A method of manufacturing a semiconductor device is provided. The method includes the following steps. A substrate including a first transistor having a first conductivity type, a second transistor having a second conductivity type and a third transistor having the first conductivity type is formed. An inner-layer dielectric layer is formed on the substrate, and includes a first gate trench corresponding to the first transistor, a second gate trench corresponding to the second transistor and a third gate trench corresponding to the third transistor. A work function metal layer is formed on the inner-layer dielectric layer. An anti-reflective layer is coated on the work function metal layer. The anti-reflective layer on the second transistor and on the top portion of the third gate trench is removed to expose the work function metal layer. The exposed work function metal layer is removed.

10 Claims, 3 Drawing Sheets

METHOD OF MANUFACTURING SEMICONDUCTOR DEVICE HAVING GATE METAL

BACKGROUND

1. Technical Field

The disclosure relates in general to a method of manufacturing a semiconductor device, and more particularly to a method of manufacturing a semiconductor device having better gate metal filling.

2. Description of the Related Art

With a trend toward scaling down the size of the semiconductor device, work function metals are used to replace the conventional polysilicon gate to be the control electrode that competent to the high-K gate dielectric layer. The conventional dual metal gate methods are categorized into gate first process and gate last process. Among the two main processes, the gate last process is able to avoid processes of high thermal budget and to provide wider material choices for the high-K gate dielectric layer and the metal gate, and thus gradually replaces the gate first process.

However, in the conventional gate last process, barrier layer or strained stress layer is often formed in the gate trench before forming the metals, which reduces an opening width of the gate trench. This makes it difficult to fill the gate trench with the work function metal layer and cause metal gate void issue. Eventually, the electrical performance of the transistor device having the metal gate is deteriorated.

SUMMARY

The disclosure is directed to a method of manufacturing a semiconductor device. By the steps of the manufacturing method in this disclosure, it could be easy to get better gate metal filling in the semiconductor device.

According to one embodiment, a method of manufacturing a semiconductor device is provided. The method includes the following steps. A substrate including a first transistor having a first conductivity type, a second transistor having a second conductivity type and a third transistor having the first conductivity type is formed, and the first conductivity type and the second conductivity type are complementary. An inner-layer dielectric layer is formed on the substrate, and the inner-layer dielectric layer includes a first gate trench corresponding to the first transistor, a second gate trench corresponding to the second transistor and a third gate trench corresponding to the third transistor. A work function metal layer is formed on the inner-layer dielectric layer. An anti-reflective layer is coated on the work function metal layer. The anti-reflective layer on the second transistor and on the top portion of the third gate trench is removed to expose the work function metal layer. The exposed work function metal layer is removed to form a U-shaped work function metal layer in the third gate trench.

Figure 1:
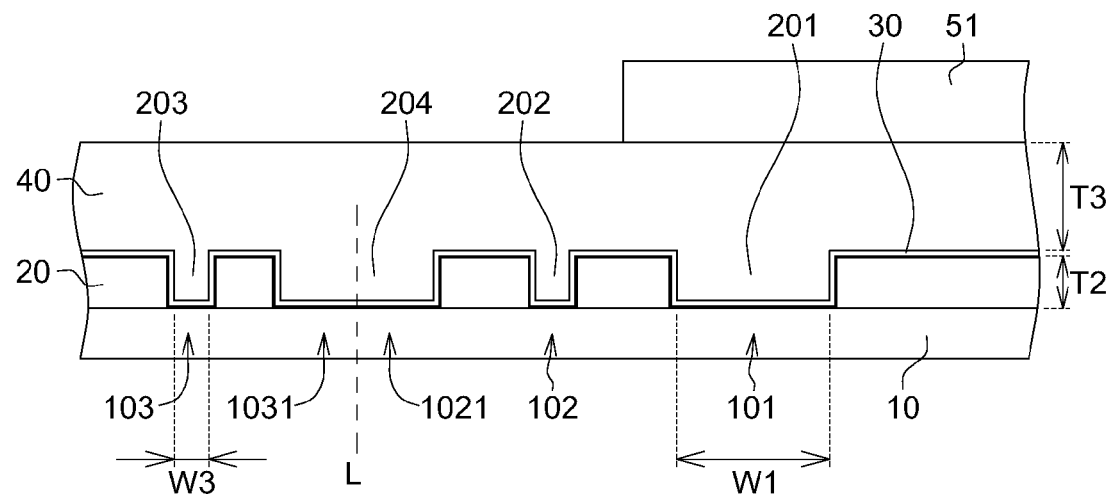
FIG. 1-7 show a process for manufacturing a semiconductor device according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The embodiments are described in details with reference to the accompanying drawings. The identical elements of the embodiments are designated with the same reference numerals. Also, it is important to point out that the illustrations may not be necessarily drawn to scale, and that there may be other embodiments of the present disclosure which are not specifically illustrated. Thus, the specification and the drawings are to be regarded as an illustrative sense rather than a restrictive sense.

FIG. 1-7 show a process for manufacturing a semiconductor device according to an embodiment of the disclosure. As shown in FIG. 1, a substrate 10 including a first transistor 101 having a first conductivity type, a second transistor 102 having a second conductivity type and a third transistor 103 having the first conductivity type is formed. The first conductivity type and the second conductivity type are complementary. For example, the first conductivity type may be P-type and the second conductivity type may be N-type in this embodiment.

Then, an inner-layer dielectric layer 20 is formed on the substrate 10. The inner-layer dielectric layer 20 may include a first gate trench 201 corresponding to the first transistor 101, a second gate trench 202 corresponding to the second transistor 102 and a third gate trench 203 corresponding to the third transistor 103.

In one embodiment, the first gate trench 201, the second gate trench 202 and the third gate trench 203 may be formed simultaneously. Further, an opening width W1 of the first gate trench 201 is lager than an opening width W3 of the third gate trench 203. For example, the opening width W1 of the first gate trench 201 may be larger than 40 nm, while the opening width W3 of the third gate trench 203 may be smaller than 35 nm, but it does not limited thereto.

In one embodiment, the substrate 10 may be a polysilicon layer and further include another second transistor 1021 and third transistor 1031. Besides, the inner-layer dielectric layer may include a common gate trench 204 corresponding to the second transistor 1021 and the third transistor 1031, such that the second transistor 1021 and the third transistor 1031 may have a common gate metal layer.

As shown in FIG. 1, a work function metal layer 30 is formed on the inner-layer dielectric layer 20. That is, work function metal layer 30 is formed on the inner-layer dielectric layer 20 and in the first gate trench 201, the second gate trench 202, the third gate trench 203 and the common gate trench 204.

In one embodiment, the inner-layer dielectric layer 20 may include Tantalum Nitride (TaN), and the work function metal layer 30 may include Titanium Nitride (TiN). However, the composition of the inner-layer dielectric layer 20 and the work function metal layer 30 in this disclosure are not limited therein.

Then, an anti-reflective layer 40 is coated on the work function metal layer 30. In one embodiment, the anti-reflective layer 40 may have an initial thickness T3 measured from the portion of the work function metal layer 30 disposed on the inner-layer dielectric layer 20 ranging between 1000 Å and 2500 Å, and a thickness T2 of the inner-layer dielectric layer 20 measured from the top surface of the first transistor 101 may be about 500 Å. Besides, the anti-reflective layer 40 may be a DUV light absorbing oxide (DUO) or a bottom anti-reflective coating (BARC).

Then, a first masking layer 51 may be formed to cover the first gate trench 201. In one embodiment, the first masking layer 51 may be patterned beforehand, such that the first masking layer 51 could easily cover the first gate trench 201 and expose the anti-reflective layer 40 disposed on other gate trenches, such as the second gate trench 202, the third gate trench 203 and the common gate trench 204.

Figure 2:
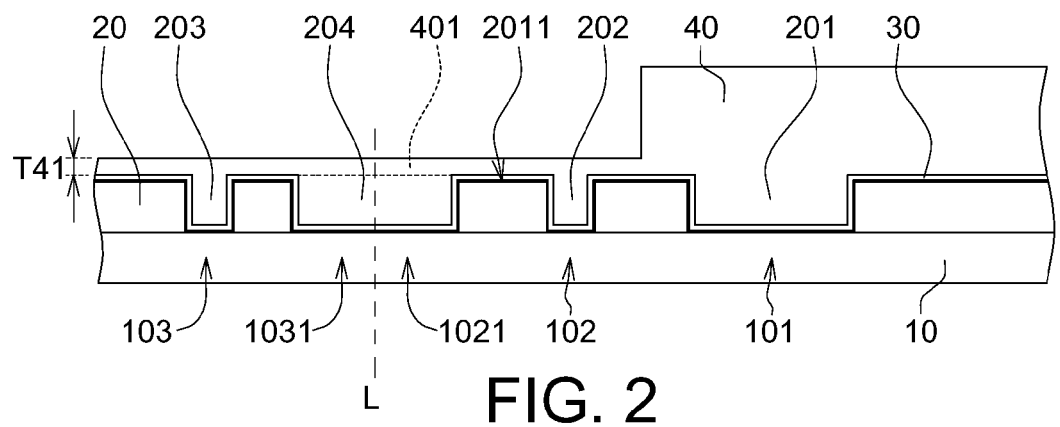

As shown in FIG. 2, a portion of the anti-reflective layer 40 (which is not covered by the first masking layer 51) is etched to leave a first remaining portion 401 on upper surface 2011 of the inner-layer dielectric layer 20 on the second transistors 102, 1021 and the third transistors 103, 1031. In one embodiment, a thickness T41 of the first remaining portion 401 measured from the portion of the work function metal layer 30 disposed on the inner-layer dielectric layer 20 may be between 200 Å and 300 Å. Then, the first masking layer 51 is removed.

Figure 3:
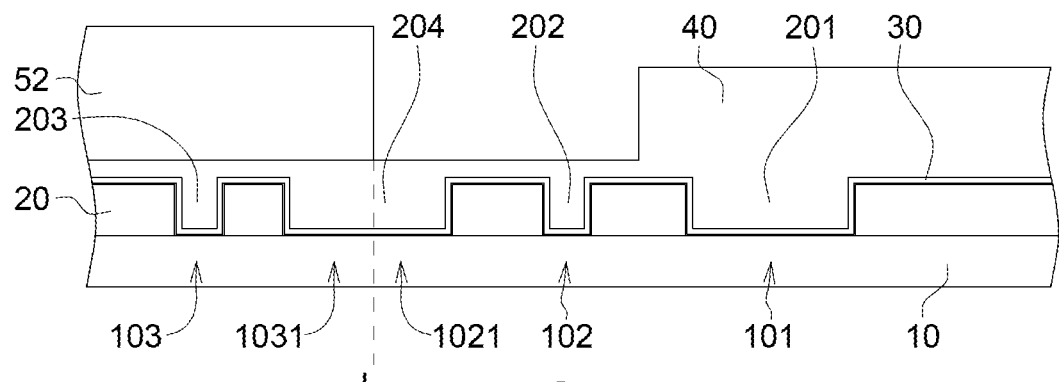

As shown in FIG. 3, a second masking layer 52 is formed to cover the third gate trench 103 and a portion of the common gate trench 204 corresponding to the third transistor 1031. Similarly, the second masking layer 52 may be patterned beforehand, such that the second masking layer 52 could easily cover the third gate trench 103 and the portion of the common gate trench 204 corresponding to the third transistor 1031, and expose the anti-reflective layer 40 disposed on other gate trenches, such as the first gate trench 201, the second gate trench 202 and a portion of the common gate trench 204 corresponding to the second transistor 1021.

Figure 4:
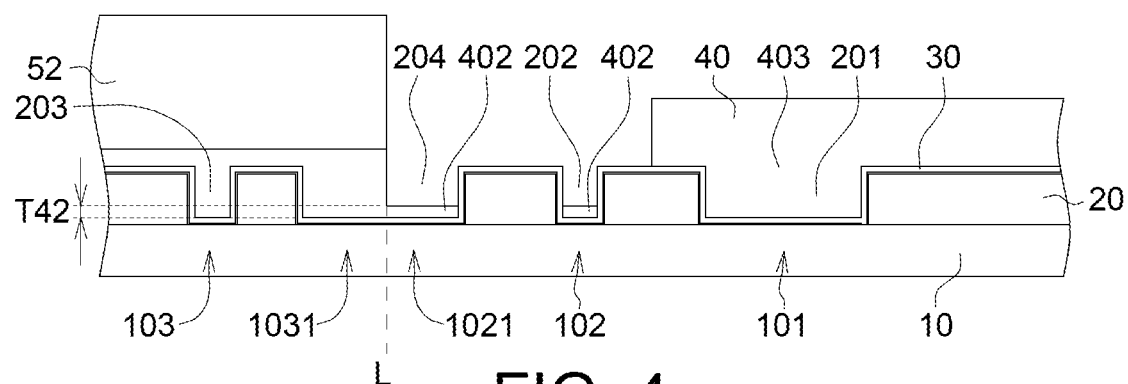

As shown in FIG. 4, a portion of the anti-reflective layer 40 is etched to leave a second remaining portion 402 in the second gate trench 202 and the portion of the common gate trench 204 corresponding to the second transistor 1021 and to leave a third remaining portion 403 of the anti-reflective layer 40 disposed on the first gate trench 201. In one embodiment, a thickness T42 of the second remaining portion 402 may be between 100 Å and 200 Å. Then, the second masking layer 52 is removed.

Figure 5:
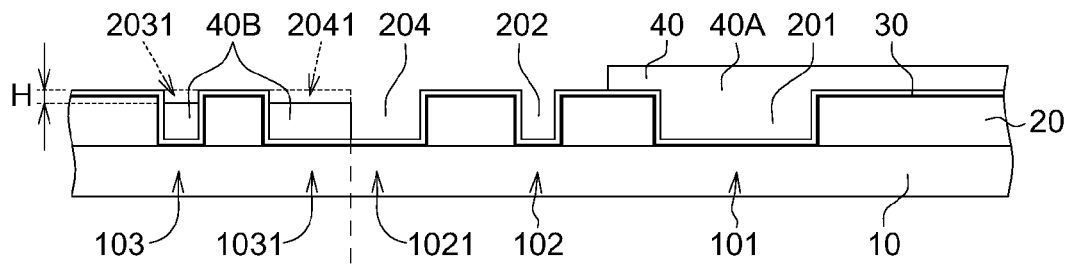

As shown in FIG. 5, a portion of the anti-reflective layer 40 is etched to remove the second remaining portion 402 in the second gate trench 202 and a portion of the third remaining portion 403 of the anti-reflective layer 40 disposed on the first gate trench 201 to leave a first capping portion 40A of the anti-reflective layer 40 in the first gate trench 201 and a second portion 40B of the anti-reflective layer 40 in the third gate trench 203 and a portion of the common gate trench 204, so as to expose the work function metal layer 30 on the second transistors 102, 1021 and on the top portion 2031 of the third gate trench 203 and the top portion 2041 of the common gate trench 204 corresponding to the third transistor 1031. Wherein the first capping portion 40A and the second portion 40B of the anti-reflective layer 40 have different levels measured from the top surface of the substrate 10. In one embodiment, a height H measured from the top surface of the second portion 40B to the top portion 2031 of the third gate trench 203 and the top portion 2041 of the common gate trench 204 range between 150 Å and 300 Å.

Figure 6:
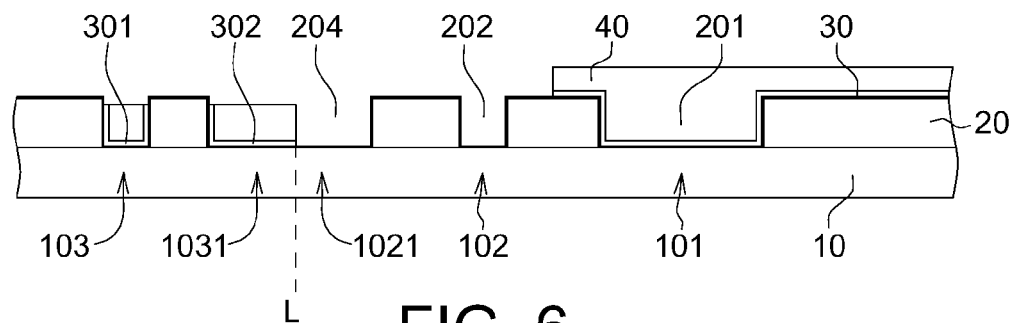

As shown in FIG. 6, the exposed work function metal layer is removed to form a U-shaped work function metal layer 301 in the third gate trench 203 and an L-shaped work function metal layer 301 in the portion of the common gate trench 204 corresponding to the third transistor 1031.

Figure 7:
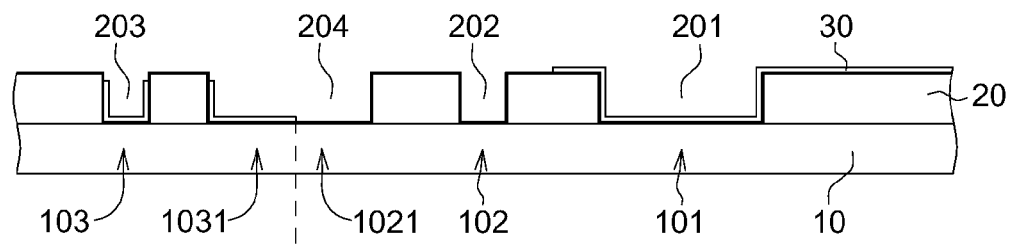

As shown in FIG. 7, the remained anti-reflective layer 40 is removed, such that the work function metal layer 301 is disposed in the first gate trench 201, the third gate trench 203 and the portion of the common gate trench 204 corresponding to the third transistor 1031.

After the processes illustrated in FIGS. 1-7, a gate metal material may be deposited in the first gate trench 201, the second gate trench 202, the third gate trench 203 and the common gate trench 204.

In conventional method, it should include two anti-reflective layer coating and removing processes, one of which is for removing the work function metal layer on the N-MOS transistor, and another one of which is for removing the work function metal layer on the top portion of the P-MOS transistor.

In comparison with the conventional method, the manufacturing method according to this disclosure could save one anti-reflective layer coating process and one anti-reflective layer removing process. Besides, the work function metal layer etching process on the N-MOS transistor and the top portion of the P-MOS transistor may be completed at the same time by the manufacturing method according to this disclosure.

Further, the metal gate void issue and the mask alignment issue between the interface (such as interface L shown in the Figures) of the P-MOS transistor and N-MOS transistor in using two-mask process may be prevent in this disclosure.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method of manufacturing a semiconductor device, comprising:
   forming a substrate including a first transistor having a first conductivity type, a second transistor having a second conductivity type and a third transistor having the first conductivity type, wherein the first conductivity type and the second conductivity type are complementary;
   forming an inner-layer dielectric layer on the substrate, wherein the inner-layer dielectric layer comprises a first gate trench corresponding to the first transistor, a second gate trench corresponding to the second transistor and a third gate trench corresponding to the third transistor;
   forming a work function metal layer on the inner-layer dielectric layer;
   coating an anti-reflective layer on the work function metal layer to fill the first gate trench, the second gate trench and the third gate trench;
   etching portions of the anti-reflective layer that are respectively filled in the first gate trench, the second gate trench and the third gate trench to expose portions of the work function metal layer and to leave a first capping portion and a second capping portion of the anti-reflective layer with different levels respectively in the first gate trench and the third gate trench; and
   removing the exposed portions of the work function metal layer to form a U-shaped work function metal layer in the third gate trench.

2. The method according to claim 1, wherein the step of etching the portions of the anti-reflective layer that are respectively filled in the first gate trench, the second gate trench and the third gate trench to expose the work function metal layer comprises:
   forming a first masking layer to cover the first gate trench;
   etching a portion of the anti-reflective layer uncovered by the first masking layer to leave a first remaining portion of the anti-reflective layer on the second transistor and the third transistor;
   removing the first masking layer;

forming a second masking layer to cover the third gate trench;

etching a portion of the anti-reflective layer uncovered by the second masking layer to leave a second remaining portion of the anti-reflective layer in the second gate trench and to leave a third remaining portion of the anti-reflective layer disposed on the first gate trench;

removing the second masking layer; and etching a portion of the anti-reflective layer to remove the second remaining portion and a portion of the third remaining portion of the anti-reflective layer, so as to expose the work function metal layer on the second transistor and to leave the first capping portion of the anti-reflective layer in the first gate trench and the second capping portion of the anti-reflective layer in the third gate trench.

3. The method according to claim 2, wherein a thickness of the first remaining portion measured from a portion of the work function metal layer disposed on the inner-layer dielectric layer is between 200 Å and 300 Å, and a thickness of the second remaining portion is between 100 Å and 200 Å.

4. The method according to claim 1, further comprising: depositing gate metal material in the first gate trench, the second gate trench and the third gate trench.

5. The method according to claim 1, wherein an opening width of the first gate trench is larger than an opening width of the third gate trench.

6. The method according to claim 1, wherein the first gate trench, the second gate trench and the third gate trench are formed simultaneously.

7. The method according to claim 1, wherein the anti-reflective layer has an initial thickness measured from a non-trench portion of the work function metal layer disposed on the inner-layer dielectric layer ranging between 1000 Å and 2500 Å, prior to the etching of the anti-reflective layer.

8. The method according to claim 1, wherein a thickness of the inner-layer. dielectric layer is 500 Å.

9. The method according to claim 1, wherein the anti-reflective layer is a bottom anti-reflective coating.

10. The method according to claim 1, wherein the first conductivity type is P-type and the second conductivity type is N-type.

* * * * *